(12) United States Patent
Dodge et al.

(10) Patent No.: US 7,099,180 B1
(45) Date of Patent: Aug. 29, 2006

(54) PHASE CHANGE MEMORY BITS RESET THROUGH A SERIES OF PULSES OF INCREASING AMPLITUDE

(75) Inventors: Rick K. Dodge, Santa Clara, CA (US); Federica Ottogalli, Milan (IT); Egidio Buda, Lentini (IT); Marco Ferraro, Tricase (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/058,797

(22) Filed: Feb. 15, 2005

(51) Int. Cl.
*G11C 11/00* (2006.01)

(52) U.S. Cl. .................. 365/148; 365/163

(58) Field of Classification Search ................ 365/100, 365/148, 163, 185.19, 185.22
See application file for complete search history.

(56) References Cited

U.S. PATENT DOCUMENTS

| | | | |
|---|---|---|---|
| 4,225,946 A | | 9/1980 | Neale et al. ............... 365/163 |
| 5,537,358 A | * | 7/1996 | Fong ........................ 365/218 |
| 6,327,183 B1 | * | 12/2001 | Pawletko et al. ...... 365/185.18 |
| 6,525,961 B1 | * | 2/2003 | Rolandi et al. ........ 365/185.03 |
| 6,714,448 B1 | * | 3/2004 | Manea ................... 365/185.03 |
| 6,754,107 B1 | * | 6/2004 | Khouri et al. ......... 365/185.23 |
| 6,813,177 B1 | * | 11/2004 | Lowrey et al. ............. 365/148 |
| 2004/0114419 A1 | | 6/2004 | Lowrey et al. ............. 365/148 |
| 2004/0228163 A1 | * | 11/2004 | Khouri et al. ............. 365/154 |
| 2005/0141261 A1 | | 6/2005 | Ahn ........................... 365/148 |

FOREIGN PATENT DOCUMENTS

EP     1 450 373     8/2004

* cited by examiner

*Primary Examiner*—Andrew Q. Tran
(74) *Attorney, Agent, or Firm*—Trop, Pruner & Hu, P.C.

(57) ABSTRACT

A set bit in a phase change memory may be programmed to a reset bit using a series of pulses of increasing amplitude. An initial start pulse is applied. After the start pulse is applied, a check determines whether the bit has been reset. If not, a higher amplitude pulse is applied. Each time the pulse amplitude is to be incremented, a check determines whether a maximum safe pulse amplitude has been exceeded. The pulse amplitude is continually incremented until either the maximum is reached or all the bits to be programmed have been programmed into the correct reset state.

6 Claims, 6 Drawing Sheets

PHASE CHANGE MEMORY BITS RESET THROUGH A SERIES OF PULSES OF INCREASING AMPLITUDE

BACKGROUND

This invention relates generally to semiconductor memories.

Phase change memory devices use phase change materials, i.e., materials that may be electrically switched between a generally amorphous and a generally crystalline state, as an electronic memory. One type of memory element utilizes a phase change material that may be, in one application, electrically switched between generally amorphous and generally crystalline local orders or between different detectable states of local order across the entire spectrum between completely amorphous and completely crystalline states.

Typical materials suitable for such an application include various chalcogenide elements. The state of the phase change materials is also non-volatile. When the memory is set in either a crystalline, semi-crystalline, amorphous, or semi-amorphous state representing a resistance value, that value is retained until reprogrammed, even if power is removed. This is because the programmed value represents a phase or physical state of the material (e.g., crystalline or amorphous).

DETAILED DESCRIPTION

Figure 1:
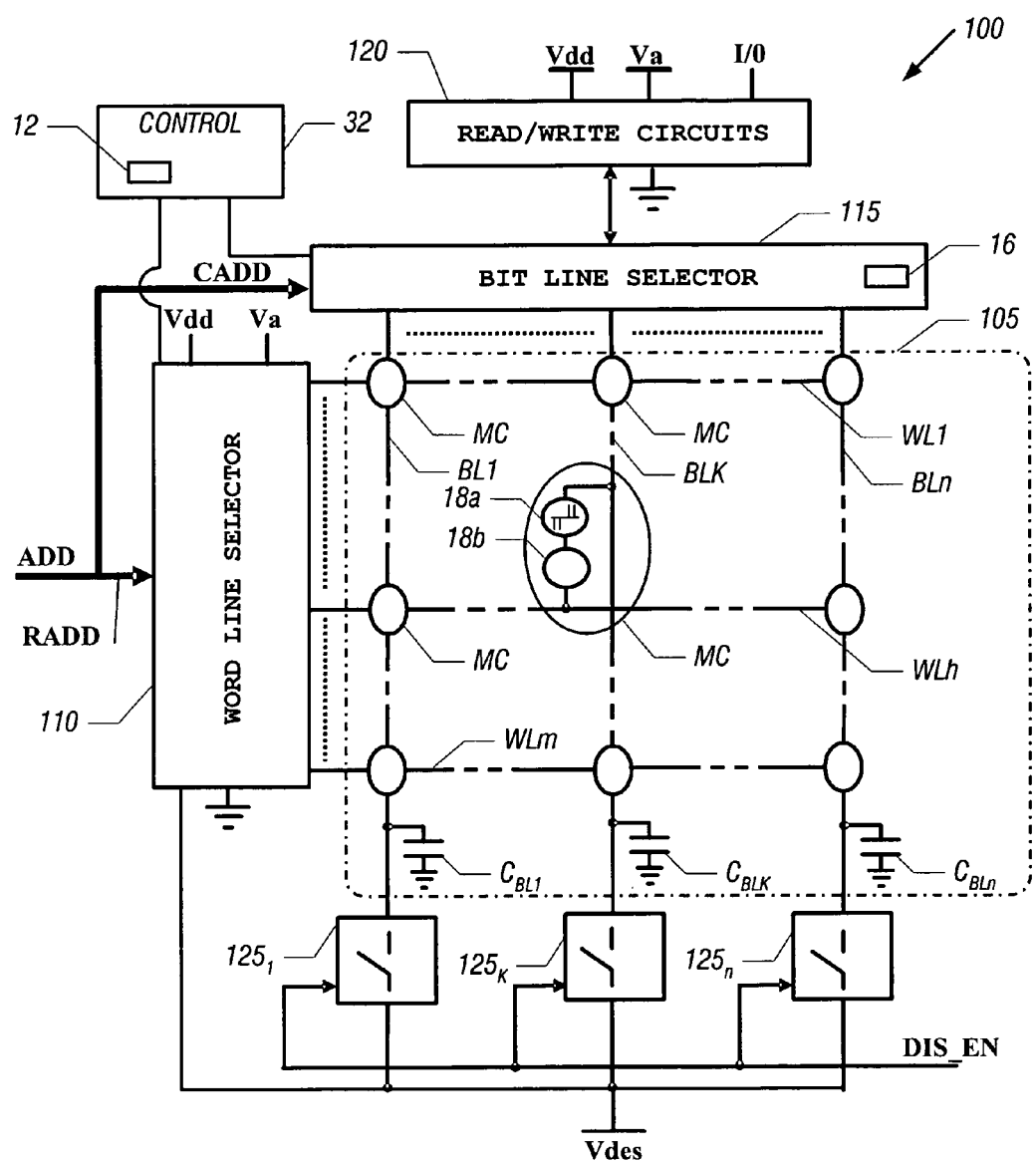
FIG. 1 is a circuit diagram for one embodiment of the present invention.

Referring to FIG. 1, in one embodiment, a memory 100 may include an array of memory cells MC arranged in rows WL and columns BL in accordance with one embodiment of the present invention. While a relatively small array is illustrated, the present invention is in no way limited to any particular size of an array. While the terms "rows," "word lines," "bit lines," and "columns" are used herein, they are merely meant to be illustrative and are not limiting with respect to the type and style of the sensed array.

The memory device 100 includes a plurality of memory cells MC typically arranged in a matrix 105. The memory cells MC in the matrix 105 may be arranged in m rows and n columns with a word line WL1–WLm associated with each matrix row, and a bit line BL1–BLn associated with each matrix column.

The memory device 100, in one embodiment, may also include a number of auxiliary lines including a supply voltage line Vdd, distributing a supply voltage Vdd through a chip including the memory device 100, that, depending on the specific memory device embodiment, may be, typically, from 1 to 3 V, for example 1.8 V, and a ground voltage line GND distributing a ground voltage. A high voltage supply line Va may provide a relatively high voltage, generated by devices (e.g. charge-pump voltage boosters not shown in the drawing) integrated on the same chip, or externally supplied to the memory device 100. For example, the high voltage Va may be 4.5–5 V in one embodiment.

The cell MC may be any memory cell including a phase change memory cell. Examples of phase change memory cells include those using chalcogenide memory element 18a and an access, select, or threshold device 18b coupled in series to the device 18a. The threshold device 18b may be an ovonic threshold switch that can be made of a chalcogenide alloy that does not exhibit an amorphous to crystalline phase change and which undergoes a rapid, electric field initiated change in electrical conductivity that persists only so long as a holding voltage is present.

A memory cell MC in the matrix 105 is connected to a respective one of the word lines WL1–WLm and a respective one of the bit lines BL1–BLn. In particular, the storage element 18a may have a first terminal connected to the respective bit line BL1–BLn and a second terminal connected to a first terminal of the associated device 18b. The device 18b may have a second terminal connected to a word line WL1–WLm. Alternatively, the storage element 18a may be connected to the respective word line WL1–WLm and the device 18b, associated with the storage element 18a, may be connected to the respective bit line BL1–BLn.

A memory cell MC within the matrix 105 is accessed by selecting the corresponding row and column pair, i.e. by selecting the corresponding word line and bit line pair. Word line selector circuits 110 and bit line selector circuits 115 may perform the selection of the word lines and of the bit lines on the basis of a row address binary code RADD and a column address binary code CADD, respectively, part of a memory address binary code ADD, for example received by the memory device 100 from a device external to the memory (e.g., a microprocessor). The word line selector circuits 110 may decode the row address code RADD and select a corresponding one of the word lines WL1–WLm, identified by the specific row address code RADD received. The bit line selector circuits 115 may decode the column address code CADD and select a corresponding bit line or, more generally, a corresponding bit line packet of the bit lines BL1–BLn. For example, the number of selected bit lines depending on the number of data words that can be read during a burst reading operation on the memory device 100. A bit line BL1–BLn may be identified by the received specific column address code CADD.

The bit line selector circuits 115 interface with read/write circuits 120. The read/write circuits 120 enable the writing of desired logic values into the selected memory cells MC, and reading of the logic values currently stored therein. For example, the read/write circuits 120 include sense amplifiers together with comparators, reference current/voltage generators, and current pulse generators for reading the logic values stored in the memory cells MC.

In one embodiment, in a stand-by operating condition, as well as before any read or write access to the memory device 100, the word line selection circuits 110 may keep the word lines WL1–WLm at a relatively high de-selection voltage Vdes (e.g., a voltage roughly equal to half the high voltage Va (Va/2)). At the same time, the bit line selection circuits 115 may keep the bit lines BL1–BLn disconnected, and thus isolated, from the read/write circuits 120 or, alternatively, at the de-selection voltage Vdes. In this way, none of the memory cells MC is accessed, since the bit lines BL1–BLn are floating or a voltage approximately equal to zero is dropped across the access elements 18b.

During a reading or a writing operation, the word line selection circuits 110 may lower the voltage of a selected one of the word lines WL1–WLm to a word line selection voltage $V_{WL}$ (for example, having a value equal to 0V—the ground potential), while the remaining word lines may be kept at the word line de-selection voltage Vdes in one embodiment. Similarly, the bit line selection circuits 115 may couple a selected one of the bit lines BL1–BLn (more typically, a selected bit line packet) to the read/write circuits 120, while the remaining, non-selected bit lines may be left floating or held at the de-selection voltage, Vdes. Typically, when the memory device 100 is accessed, the read/write circuits 120 force a suitable current pulse into each selected bit line BL1–BLn. The pulse amplitude depends on the reading or writing operations to be performed.

In particular, during a reading operation a relatively high read current pulse is applied to each selected bit line in one embodiment. The read current pulse may have a suitable amplitude and a suitable time duration. The read current causes the charging of stray capacitances $C_{BL1}$–$C_{BLn}$ (typically, of about 1 pF), intrinsically associated with the bit lines BL1–BLn, and, accordingly, a corresponding transient of a bit line voltage $V_{BL}$ at each selected bit line BL1–BLn. When the read current is forced into each selected bit line BL1–BLn, the respective bit line voltage raises towards a corresponding steady-state value, depending on the resistance of the storage element 18a, i.e., on the logic value stored in the selected memory cell MC. The duration of the transient depends on the state of the storage element 18a. If the storage element 18a is in the crystalline state and the threshold device 18b is switched on, a cell current flowing through the selected memory cell MC has an amplitude greater than the amplitude in the case where the storage element 18a is in the higher resistivity or reset state.

The logic value stored in the memory cell MC may, in one embodiment, be evaluated by means of a comparison of the bit line voltage (or another voltage related to the bit line voltage) at, or close to, the steady state thereof with a suitable reference voltage, for example, obtained exploiting a service reference memory cell. The reference voltage can, for example, be chosen to be an intermediate value between the bit line voltage when a logic value "0" is stored and the bit line voltage when a logic value "1" is stored.

In order to avoid spurious reading of the memory cells MC, the bit line stray capacitances $C_{BL1}$–$C_{BLn}$ may be discharged before performing a read operation. To this purpose, bit line discharge circuits $125_1$–$125_n$ are provided, associated with the bit lines BL1–BLn. The bit line discharge circuits $125_1$–$125_n$ may be enabled in a bit line discharge phase of the memory device operation, preceding any operation, for discharging the bit line stray capacitances $C_{BL1}$–$C_{BLn}$, in one embodiment.

The bit line discharge circuits $125_1$–$125_n$ may be implemented by means of transistors, particularly N-channel MOSFETs having a drain terminal connected to the corresponding bit line BL1–BLn, a source terminal connected to a de-selection voltage supply line Vdes providing the de-selection voltage Vdes and a gate terminal controlled by a discharge enable signal DIS_EN in one embodiment. Before starting a writing or a reading operation, the discharge enable signal DIS_EN may be temporarily asserted to a sufficiently high positive voltage, so that all the discharge MOSFETs turn on and connect the bit lines BL1–BLn to the de-selection voltage supply line Vdes. The discharge currents that flow through the discharge transistors cause the discharge of the bit line stray capacitances $C_{BL1}$–$C_{BLn}$ for reaching the de-selection voltage Vdes. Then, before selecting the desired word line WL1–WLm, the discharge enable signal DIS_EN is de-asserted and the discharge MOSFETs turned off.

A phase change material, used in the devices 18a and 18b, may include a chalcogenide material. A chalcogenide material may be a material that includes at least one element from column VI of the periodic table or may be a material that includes one or more of the chalcogen elements, e.g., any of the elements of tellurium, sulfur, or selenium. Chalcogenide materials may be non-volatile memory materials that may be used to store information that is retained even after the electrical power is removed.

In one embodiment, the phase change material may be chalcogenide element composition from the class of tellurium-germanium-antimony ($Te_xGe_ySb_z$) material or a GeSbTe alloy, although the scope of the present invention is not limited to just these materials.

In one embodiment, if the memory material is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state. Accordingly, in this embodiment, the memory material may be adapted to be altered to a particular one of a number of resistance values within a range of resistance values to provide digital or analog storage of information.

Programming of the memory material to alter the state or phase of the material may be accomplished by applying voltage potentials to the selected lines BL, WL, thereby generating a voltage potential across the memory material. An electrical current may flow through a portion of the memory material in response to the applied voltage potentials, and may result in heating of the memory material.

This controlled heating and subsequent controlled cooling may alter the memory state or phase of the memory material. Altering the phase or state of the memory material may alter an electrical characteristic of the memory material. For example, resistance of the material may be altered by altering the phase of the memory material. Either all or a portion of the phase change memory material may be altered during the writing pulse (i.e. only a portion/region of sensing device 18a adjacent to either a top or bottom electrode may be phase changed during the write operation). In one embodiment, primarily the portion of memory material that undergoes phase change is the region that is adjacent to the smaller lower electrode. The memory material may also be referred to as a programmable resistive material or simply a programmable resistance material.

In one embodiment, a voltage pulse with a potential difference of about 0.5 to 1.5 volts may be applied across a portion of the memory material by applying about 0 volts to a lower line (e.g., a column line BL) and about 0.5 to 1.5 volts to an upper line (e.g., a row line WL). A current flowing through the memory material in response to the applied voltage potentials may result in heating of the memory material. This heating and subsequent cooling may alter the memory state or phase of the material.

In a "reset" state, the memory material may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted.

Due to electrical current, the memory material may be heated to a relatively higher temperature and then subsequently cooled at a fast rate to amorphisize memory material and "reset" memory material. Heating the volume or memory material to a relatively lower crystallization temperature may crystallize memory material and "set" memory material. Various resistances of memory material may be achieved to store information by varying the amount of current flow and duration through the volume of memory material, or by tailoring the edge rate of the trailing edge of the programming current or voltage pulse (that may impact the cooling rate of the select memory element).

The information stored in memory material may be read by measuring the resistance of the memory material. As an example, a read current may be provided to the memory material using opposed lines BL, WL and a resulting read voltage across the memory material may be compared against a reference voltage using, for example, the sense amplifier. The read voltage may be proportional to the resistance exhibited by the selected memory storage device 18a.

In a low voltage or low field regime, the threshold device 18b, which may be an OTS (Ovonic Threshold Switch) or equivalent, is off and may exhibit very high resistance in some embodiments. The off resistance can, for example, range from 50,000 ohms to greater than 10 gigaohms at a bias of half the threshold voltage. The device 18b may remain in its off state until exceeding a threshold voltage or until a threshold current switches the device 18b to a highly conductive, low resistance on state. The voltage across the device 18b after turn on drops to a slightly lower voltage, called the holding voltage $V_H$ and remains very close to this holding voltage almost regardless of current flowing since the dynamic resistance is very low, frequently less than 1000 ohms (now in series with its holding voltage $V_H$). In one preferred embodiment of the present invention, as an example, the threshold voltage may be on the order of 3.1 volts and the holding voltage may be on the order of 2.9 volts.

After passing through the snapback region, in the on state, the device 18b voltage drop remains close to the holding voltage as the current passing through the device is increased, even if up to a relatively high, current level. Above that current level the device remains on but displays a finite differential resistance with the voltage drop increasing with increasing current. The device 18b may remain on until the current through the device 18b is reduced below a characteristic holding current value that is dependent on the area of the material and may be impacted by the top and bottom electrodes utilized to form the device 18b.

In some embodiments of the present invention, the threshold device 18b does not change phase. It remains permanently amorphous and its current-voltage characteristics may remain the same throughout its operating life.

As an example, for a 0.5 micrometer diameter device 18b formed of TeAsGeSSe having respective atomic percents of 16/13/15/1/55, the holding current may be on the order of 10 to 100 micro-amps (uA) in one embodiment. Below this holding current, the device 18b turns off and returns to the high resistance regime at low voltage, low field. The threshold current for the device 18b may generally be of the same order as the holding current. The holding current may be altered by changing process variables, such as the top and bottom electrode material and the chalcogenide material. The device 18b may provide high "on current" for a given area of device compared to conventional access devices such as metal oxide semiconductor field effect transistors or bipolar junction transistors or semiconductor diodes. However, such devices may also be used in some embodiments.

The bit line selector circuits 115 may include a current source 16. The current source 16 may controllably provide the current needed by the selected bit line for either reading, writing, or writing either a set or a reset bit. Each of these operations requires a different current. In accordance with one embodiment of the present invention, a single current source 16 controllably supplies the appropriate current for each of these operations. Control over the current supplied may be provided by a control 32. In one embodiment, the control 32 may be a processor and may include a state machine 12.

Figure 2:
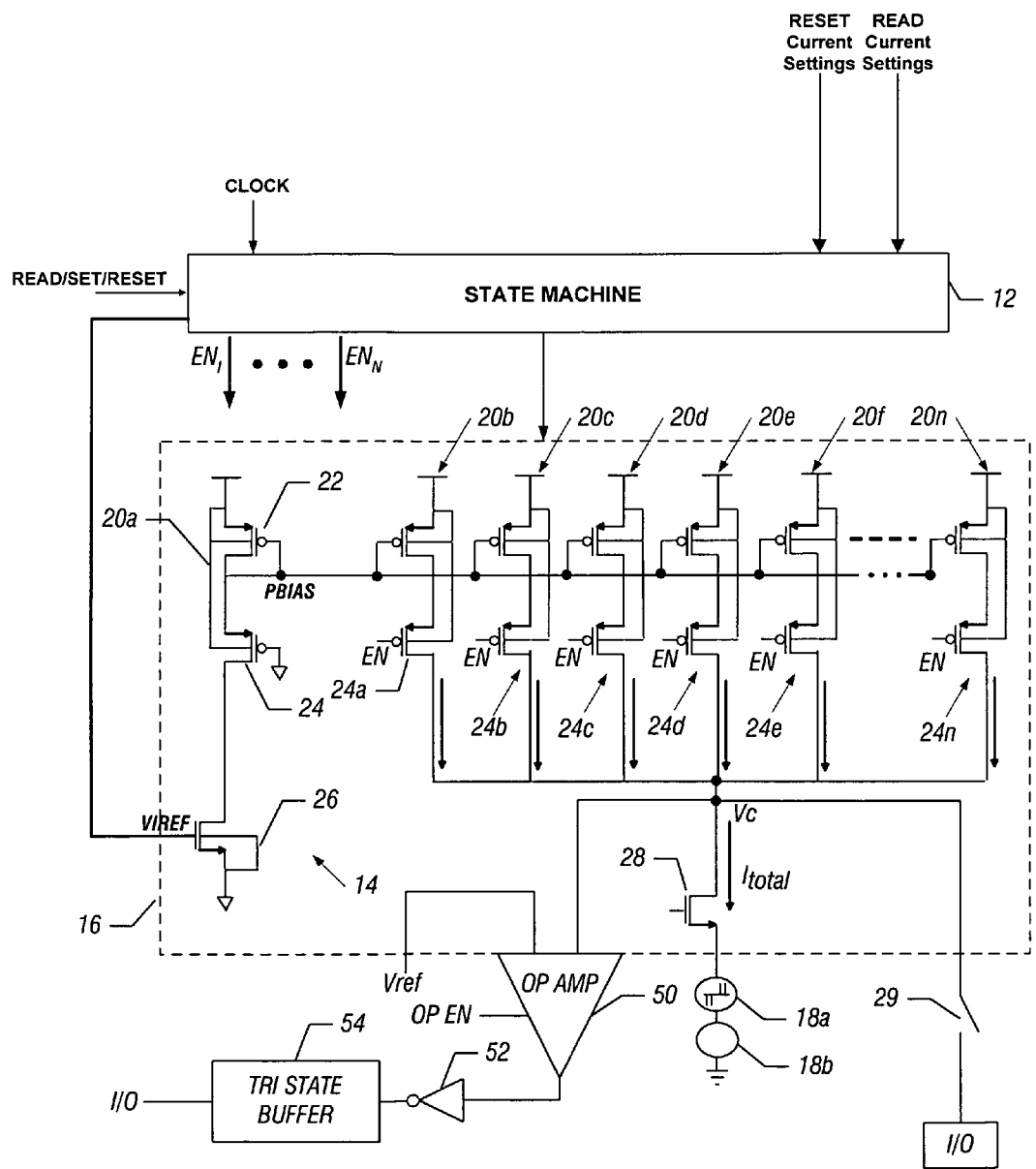
FIG. 2 is a circuit diagram for the current sources for the read/write circuits shown in FIG. 1.

Referring to FIG. 2, the state machine 12 of the control 32 may communicate with the current source 16. In particular, the state machine 12 may receive reset current settings and read current settings as indicated in FIG. 2. The reset current settings provide information about what current should be provided for writing a reset bit. Similarly, the read current settings provide information about what current should be used for reading. The information may change from wafer run to run. That is, variations in wafers in particular runs may be accounted for by providing appropriate inputs to the state machine 12. In addition, the state machine 12 receives information about whether a read operation is implemented or whether a set or reset bit is to be written. Also, the state machine receives a clock signal.

The state machine 12 outputs a number of enable signals $EN_1$–$EN_N$. In one embodiment of the present invention, N is equal to 32. However, different numbers of enable signals EN may be utilized to provide different granularities in the amount of current provided by the current source 16.

The state machine 12 may also either generate or pass through an external voltage signal VIREF that is applied to the gate of a transistor 26. That signal may be generated, in some embodiments, based on the read current settings provided from external sources, for example, based on the characteristics of a particular wafer run. The amount of drive on the gate of the transistor 26 may control the potential at the node PBIAS. Thus, in one embodiment of the present invention, the amount of current developed by the cascode 20a may be controlled.

In one embodiment of the present invention, the cascode 20a and the transistor 26 are part of a reference circuit which generates a reference current. That reference current from the reference circuit may then be mirrored into any of the cascodes 20b–20n. In one embodiment, the number of cascodes 20b–20n may be equal to the number of enable signals EN from the state machine 12. As a result, the state machine 12 can enable all or any subset of the cascodes 20b–20n. This is because, in one embodiment, each cascode may have a transistor 24 (i.e., one of the transistors 24a–24n), which receives an enable signal EN as indicated. In other words, each enable signal from the state machine is designated for a particular cascode 20b–20n in one embodiment of the present invention.

Thus, the amount of current indicated by the arrows coming from each cascode 24a–24n may be determined in two ways. In the first way, the state machine 12 determines whether or not the cascode 24 is enabled. If a cascode is enabled, the amount of current that it passes is determined by the reference circuit and, particularly, by the drive on the gate of the transistor 26.

The current through the transistor 26 and its cascode 20a is mirrored into each of the cascodes 20b–20n. In one embodiment of the present invention, that current is approximately 5 microamps.

The node VC at the base of the cascodes 20b–20n receives whatever current is mirrored into each active cascode 20. The node VC then develops a voltage which is determined by the resistance across the selected cell MC, made up of the memory element 18a and the threshold device 18b. Thus, if the cell is in a reset state, one voltage is developed at the node VC and if the cell is in the set state, a different voltage is generated at the node VC. A pass transistor 28 provides the current through the node VC and through the threshold device 18b to ground. The node VC may also be coupled through a switch 29 to an I/O pad so that the voltage VC may be monitored externally, for example, to determine what the reference voltage should be.

The node VC may also be coupled to an operational amplifier 50, in one embodiment, that compares the voltage at the node VC to a reference voltage VREF from an external source, for example. In one embodiment, the reference voltage may be set between the voltage levels at the node VC for the set and reset bits. The operational amplifier 50 is only turned on in the read mode by using the enable signal OP EN.

The output from the operational amplifier 50 is passed through an inverter 52 to a tristate buffer 54. Thus, the operational amplifier acts as a sense amplifier to develop an output signal, indicated as I/O in FIG. 2, indicating the state of a sensed cell.

In any given lot or run of chips, it may not be known in advance what the reference voltage will be. It may be set on the fly based on the characteristics of a particular run of wafers. In one embodiment, the reference voltage may be supplied from an external pad on a test chip. In another embodiment, it may be determined by the state machine 12 based on the various inputs received by the state machine 12.

The current in the reference circuit may be adjusted as needed by setting the voltage VIREF. It is also possible to adjust the number of cascodes 20 that feed current to the node VC. These operations may be implemented under the control of the state machine 12 in some embodiments of the present invention. However, in some embodiments, it may be preferable to selectively operate the cascodes 20b–20n because it may be undesirable to have the reference voltage vary for programming and read.

Figure 3:
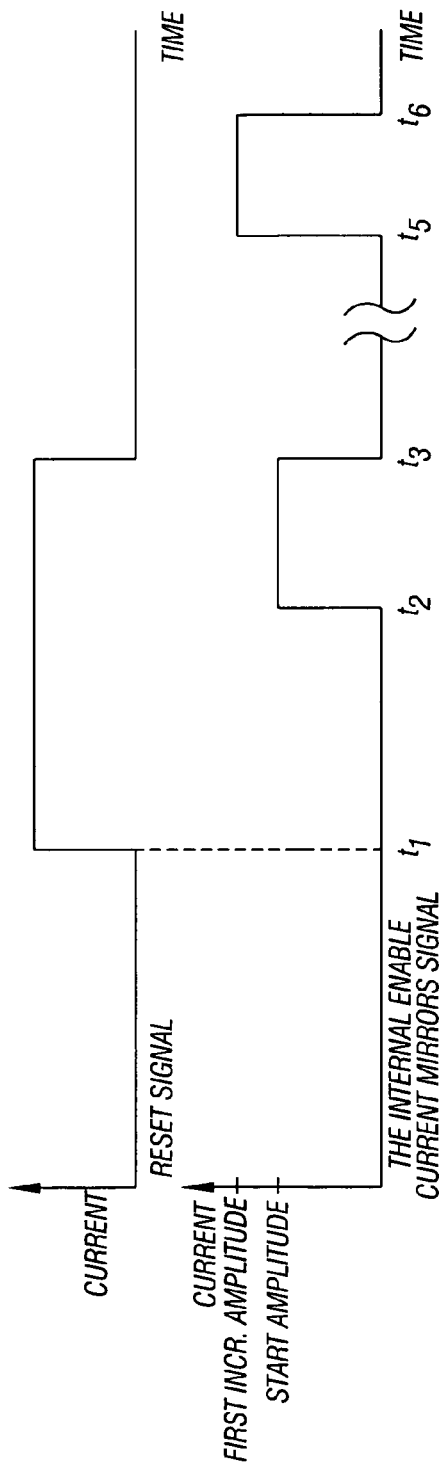
FIG. 3 is a plot of current versus time for a reset command and the resulting initial enable current mirror signal in accordance with one embodiment of the present invention.

Referring to FIG. 3, a command to write a reset level to a selected cell may have the characteristics over time as indicated in the upper plot. The internal signal, indicated in the lower plot, results from the write reset level command. This internal signal may have an adjustable delay between the time t1 and t2 in some embodiments. This adjustable delay may allow the pulse width of the resulting signal, indicated between the times t2 and t3 in FIG. 3, to be controllably adjusted. As a result of a reset command signal of a larger pulse width, a smaller pulse width internal command signal may be generated. That internal command signal may be a square wave in one embodiment. Thus, the current to write a reset bit into the selected cell may be a square wave of determined pulse width. The determination of the pulse width may be dynamically controlled by the state machine 12 in one embodiment of the present invention by setting the time delay between the time that the state machine 12 receives the external write command, indicated as a set signal, and the time, t2, when the state machine 12 provides the enable signal to the appropriate cascodes 20b–20n to generate current to the node $V_C$.

After an initial pulse is applied between time t2 and time t3, one or more additional pulses may be applied in some embodiments of the present invention. The initial pulse may be at a relatively lower start amplitude as indicated in FIG. 3. Some bits may need a higher amplitude programming pulse than other bits to reach the reset state. A check determines whether or not any bits still need to be reset after the initial start pulse amplitude is applied. If so, a second pulse may be applied, for example, between times t5 and t6, as indicated in FIG. 3. The start pulse amplitude may be incremented to provide a slightly higher first incremented amplitude, second pulse as indicated in FIG. 3.

Thereafter, progressively higher pulses may be applied until all the bits are reset or until a maximum amplitude is reached. The maximum amplitude may be an amplitude that would lead to early wear out or difficulty in achieving a subsequent set state. The higher amplitude pulses may be achieved by simply activating additional current mirrors as needed in some embodiments.

Figure 4:
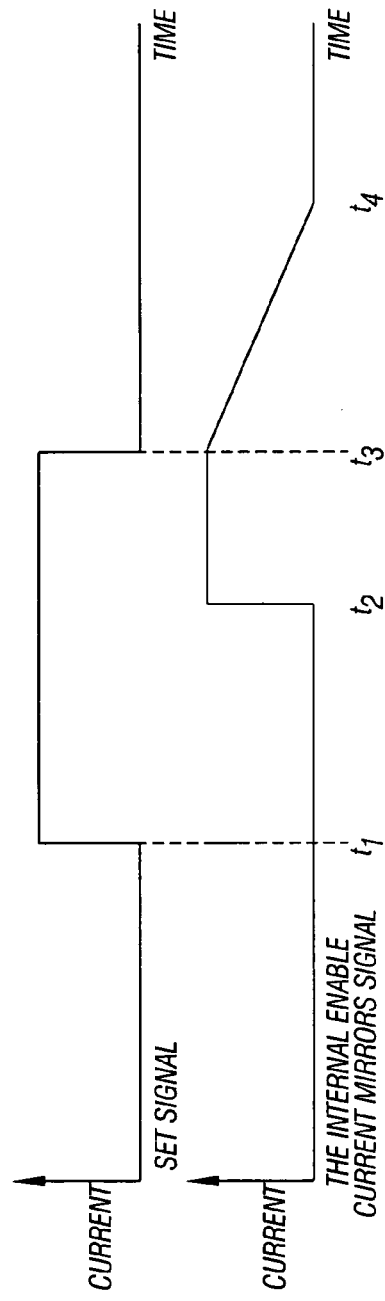
FIG. 4 is a plot of current versus time for a set command and the resulting initial enable current mirror signal in accordance with one embodiment of the present invention.

Referring to the upper plot in FIG. 4, the write a set bit command from an external source similarly has a pulse width from time t1 to t3. The internal response thereto, as indicated in the lower plot in FIG. 4, is generated by the state machine 12. That signal EN1–ENn may have a fixed delay between the time t1 and t2 in one embodiment. After the fixed delay, represented by the time t1–t2, a square pulse may be generated between the time t2 and t3.

In one embodiment, the square pulse, shown in FIGS. 3 and 4, may be generated by operating a predetermined number of the cascodes 20. For example, in one embodiment, 28 out of 32 available cascodes may be operated between the times t2 and t3.

When writing a set bit, a ramp is provided after time t3 to time t4. The ramp may be provided by turning off the active cascodes 20 one after another in timed sequence, to achieve the desired ramp slope. The cascode 20 disable signals may be timed by the clock input to the state machine 12 in one embodiment of the present invention.

The width of the programming pulse, and the slope of its ramp may be set based on inputs to the state machine 12. Those inputs may include a variety of data including the characteristics of the memory element 18a and the particular characteristics of a run of wafers.

The circuit shown in FIG. 2 may be used in a variety of conditions for a variety of different memory arrays without substantial redesign of the current source 16. This makes the current source 16 particularly adaptable to prototype development and test chips.

Thus, a highly dynamic, programmable current source 16 is provided that can programmably provide read and write currents as needed based on a variety of factors for a variety of different matrices 105 of memory cells. The memory cells in any given matrix 105 may have differences from design to design and from wafer to wafer, which may be accommodated through the operation of the state machine 12 and the controllable current source 16. The current source 16 advantageously provides single, variable level current source for reading and writing both set and reset bits in some embodiments.

In one embodiment of the present invention, programming may be achieved using currents in the range of 300 microamps to 4.8 milliamps. In one embodiment, programming in the set mode may involve changing the material to a crystalline state by keeping the temperature of the material between its melting point and its glass transition temperature for 20 to 50 nanoseconds. Programming for the reset mode may involve changing the state of the material to an amorphous state by raising the temperature of the memory material to its melting point for a short duration, such as less than 2 nanoseconds in one embodiment. For a read operation, as an example, cell currents ranging from 3 microamps to 50 microamps may be applied in some embodiments. The delay between time t1 and time t2 for a reset signal may, for example, be between 10 nanoseconds and 40 nanoseconds. The delay between time t1 and t2 for a set signal may be between 0.3 and 1.7 microsecond. Thus, different numbers of the cascodes may be operational in the read mode and in writing set and reset bits.

Figure 5:
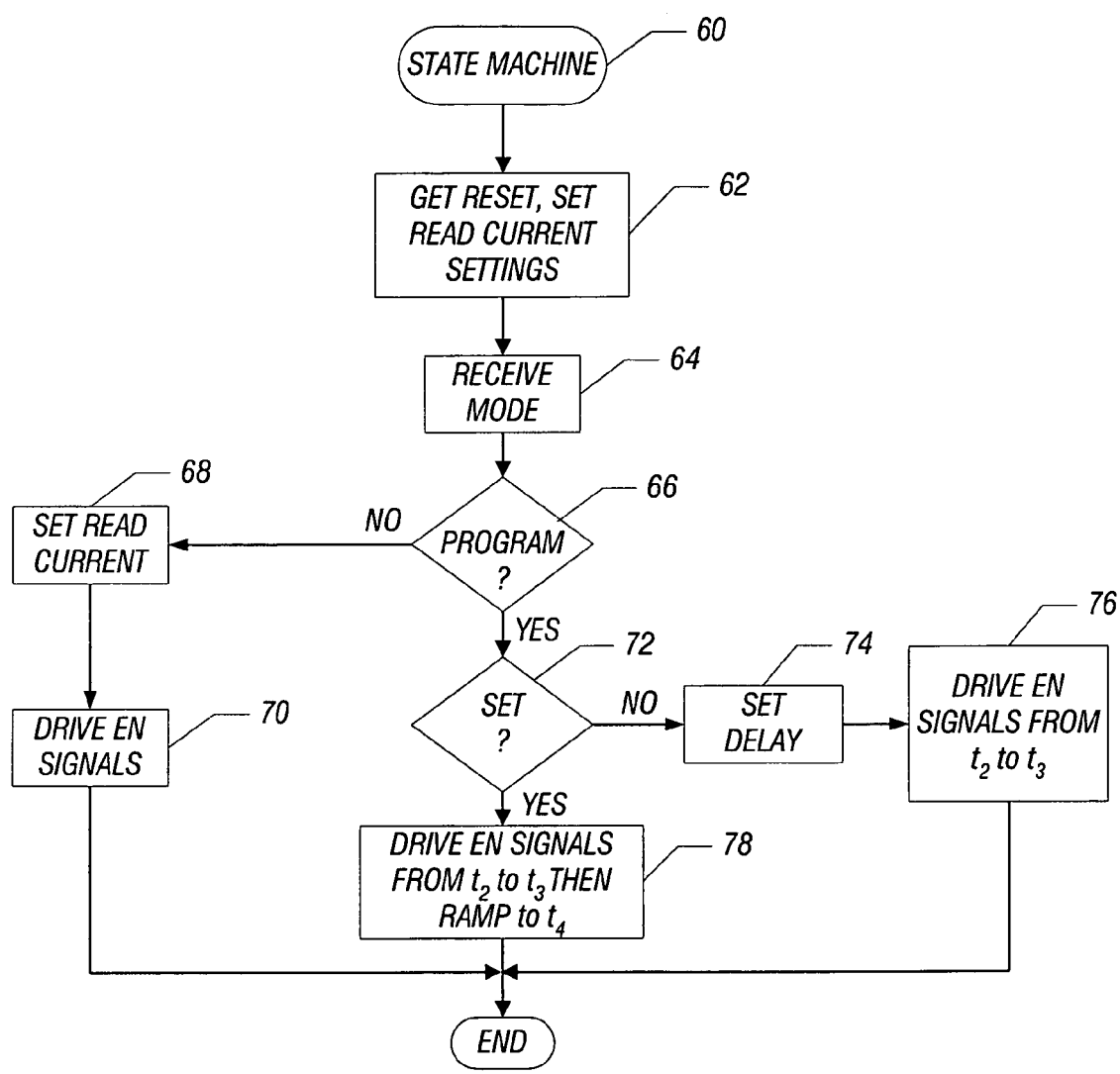
FIG. 5 is a flow chart for one embodiment of the present invention.

Referring to FIG. 5, the state machine code 60 may initially get the reset, set, and read current settings as indicated in block 62. The code 60 may be software, firmware, or hardware. These settings may be provided from external sources or may be calculated based on available information. The operation to be performed is then received and the appropriate currents calculated as indicated in block 64. At diamond 66, a check determines whether the state machine 12 is in the program mode. If so, a first check is whether or not a set bit will be written as indicated in diamond 72. If so, the delay between the times t1 and t2 is determined (block 74) and the appropriate number of enable signals are generated between the times t2 (block 76) and t3 (block 76).

Conversely, if a reset bit is to be programmed, the appropriate number of enable signals are provided between the time t2 through t3 (block 78). Thereafter, the current is ramped down to time t4. The ramping may be implemented, in one embodiment, by progressively turning off enable signals EN using the clock input to the state machine 12 to time the progressive turning off of the cascode enable signals.

If the memory device 100 is in the read mode, then the read current may be set as indicated in block 68. This may be done by controlling the signal VIREF to set the reference column current in one embodiment. In some embodiments, the read current may be set wafer to wafer at a level between the set and reset bits. However, other arrangements are also possible. In the read mode, the operational amplifier enable signal OP EN is enabled to turn on the operational amplifiers 50. The enable signals are then driven, as indicated in block 70, to provide the desired read current.

Figure 6:
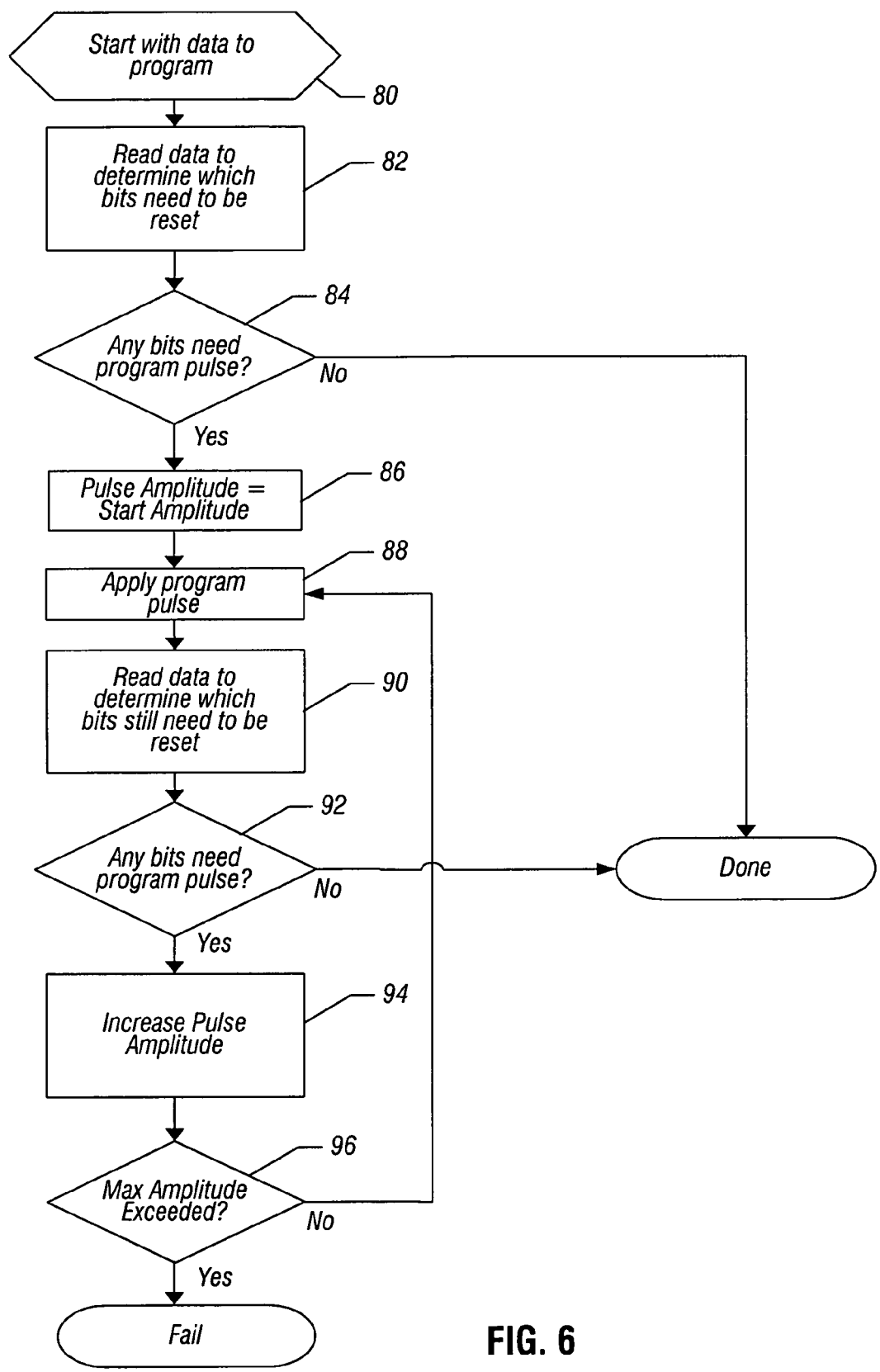
FIG. 6 is a flow chart for one embodiment of the present invention.

Referring to FIG. 6, in the case where a reset bit is to be programmed, in one embodiment, after the block 76 in FIG. 5, a series of pulses may be applied to program the reset bit. This may be necessary because some bits may need a higher voltage to be programmed than other bits. However at the same time, it is desirable not to exceed a maximum safe pulse amplitude.

To this end, initially, the data to program is received as indicated at 80. Then, the data is read to determine which bits need to be reset as indicated in block 82. A check at diamond 84 determines whether any bits need a program pulse.

If so, those bits receive a program pulse at the start amplitude as indicated in block 86 and block 88. The data is then read to determine which bits still need to be reset as indicated in block 90.

In diamond 92 a check again determines whether any of the bits still need the reset program pulse. If so, the pulse amplitude is increased as indicated in block 94. A check at diamond 96 determines whether the maximum safe amplitude has been reached.

Since each bit in the array may have different optimal pulse amplitude for reset, different pulse amplitudes may be used. However, applying at pulse greater than the optimal pulse may damage the bit leading to early wear out, and difficulty in achieving a subsequent set state.

Figure 7:
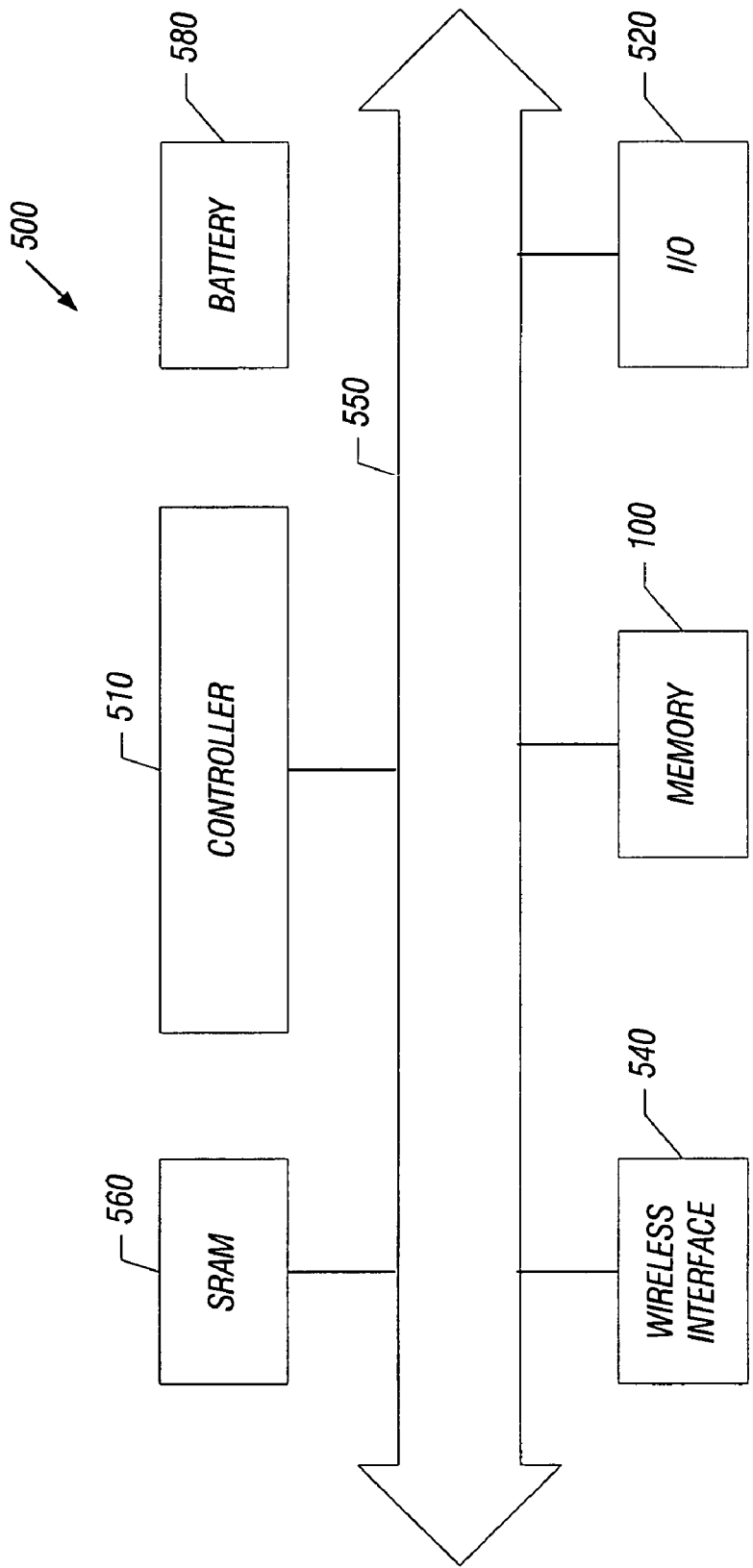
FIG. 7 is a system depiction according to one embodiment of the present invention.

Turning to FIG. 7, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 100, a wireless interface 540, and a static random access memory (SRAM) 560 and coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 100 may be used to store messages transmitted to or by system 500. Memory 100 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 100 may be provided by one or more different types of memory. For example, memory 100 may comprise a volatile memory (any type of random access memory), a non-volatile memory such as a flash memory, and/or memory 100 illustrated in FIG. 1.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase change memory comprising:
an array of phase change memory cells; and a programmable device coupled to said array, and, adapted to provide a series of program pulses of increasing amplitude to program a reset bit, said device to check after applying a pulse whether a bit has been reset by said pulse, said device adapted to determine whether a maximum safe amplitude has been reached, if said bit has not been reset by said pulse, which amplitude if exceeded would result in early wear out.

2. The memory of claim 1 including a plurality of cells including a chalcogenide material.

3. The memory of claim 2, said device to avoid the use of a program pulse that exceeds an amplitude that would lead to early wear out of a bit.

4. The memory of claim 1, said device to apply another pulse to reset said bit if said maximum safe amplitude has not been reached, said another pulse having an amplitude higher than said pulse.

5. The memory of claim 4, said device to program a plurality of bits and to program at least one of said bits with said pulse and at least one of said bits with said another pulse.

6. The memory of claim 1 wherein said pulses have progressively higher current amplitude.

* * * * *